United States Patent [19]

Martin

[11] 4,110,713

[45] Aug. 29, 1978

[54] LOW OFFSET FIELD EFFECT TRANSISTOR CORRELATOR CIRCUIT

[75] Inventor: Gayle Patrick Martin, Indialantic, Fla.

[73] Assignee: The United States of America as represented by the Secretary of the Air Force, Washington, D.C.

[21] Appl. No.: 743,386

[22] Filed: Nov. 19, 1976

[51] Int. Cl.[2] ........................ H03H 7/02; H03H 7/48; G06F 15/34; H03H 7/46

[52] U.S. Cl. .................................. 333/70 R; 307/304; 328/167; 364/819

[58] Field of Search ................ 235/181; 307/229, 220, 307/304, 264; 328/160, 167, 156, 21; 332/31 T, 16 T; 333/70 R; 357/22; 364/819, 820, 728

[56] References Cited

U.S. PATENT DOCUMENTS

| | | | |
|---|---|---|---|
| 2,921,205 | 1/1960 | Giacoletto | 357/22 X |
| 3,044,025 | 7/1962 | McCauley | 332/31 T |
| 3,131,312 | 4/1964 | Putzrath | 357/22 X |
| 3,281,718 | 10/1966 | Weberg | 332/31 T |
| 3,391,354 | 7/1968 | Ohashi et al. | 332/31 T |
| 3,772,614 | 11/1973 | Kjaersgaard | 332/16 T |

OTHER PUBLICATIONS

Naylor et al.-"Reducing Phase-Shift in Carrier-Type Analogue Multipliers" in Electronic Engineering Apr. 1971, pp. 38–40.

*Primary Examiner*—Alfred E. Smith
*Assistant Examiner*—Marvin Nussbaum
*Attorney, Agent, or Firm*—Joseph E. Rusz; Henry S. Miller

[57] ABSTRACT

A low offset field effect transistor correlator circuit where one signal is applied to a balanced input through capacitors to the drain and source electrodes of a field effect transistor and having a second signal applied to the gate of the transistor. Low pass filters are connected to the source and drain, and the correlated input signals appear across resistors connecting the outputs of the filters.

1 Claim, 2 Drawing Figures

LOW OFFSET FIELD EFFECT TRANSISTOR CORRELATOR CIRCUIT

STATEMENT OF GOVERNMENT INTEREST

The invention described herein may be manufactured and used by or for the Government for governmental purposes without the payment of any royalty thereon.

BACKGROUND OF THE INVENTION

This invention relates generally to correlator circuits and more specifically to a novel low offset correlator circuit for adaptive processors.

Adaptive processors, whether functioning with antenna arrays, acoustical sensors or in other systems require very low offset correlators in order to form appropriate nulls upon the insertion of interference signals into the system. An offset is a direct voltage in the correlator which appears as an additional signal and has the effect of diminishing the nulling performance of the system. Conventional and known correlators have offsets which are input power dependent, temperature dependent, and power supply dependent. The instant invention substantially reduces the input power dependency, essentially eliminates temperature dependency, and completely eliminates power supply dependence.

When adaptive processors are utilized with antenna systems it is important that the correlator produce no output whenever either of the two terms to be multiplied is zero or whenever the terms are in phase quadrature. Some prior art low offset correlator designs resulted in much improved performance on one hand, however, suffered either from reduced performance due to the higher signal levels necessary, higher frequencies or difficulty in obtaining well matched field effect transistor (FET) devices.

The circuit disclosed hereinafter eliminates or alleviates these disadvantages of the prior art.

SUMMARY OF THE INVENTION

The invention involves an electronic circuit that utilizes an inherently balanced passive device, which is preferably a field effect transistor, to extract multiplication products. This circuit substantially reduces offsets which are due to input power variation, temperature, and power supply variation.

The basic circuit consists of a correlator having one signal applied to a balanced input through capacitors to the drain and source electrodes of a field effect transistor while having another signal applied to the gate of the field effect transistor. Low pass filters are connected to the source and drain and the multiplied input signals appear across resistors connecting the outputs to the filters.

It is therefore an object of the invention to provide a new and improved correlator circuit.

It is another object of the invention to provide a new and improved correlator circuit that has low offset properties.

It is a further object of the invention to provide a new and improved correlator circuit that is less independent upon temperature, power supply and input power for improved output signals than similar known circuits.

It is still another object of the invention to provide a new and improved correlator circuit that utilizes a simple field effect transistor.

It is still a further object of the invention to provide a new and improved correlator circuit that is passive.

It is another object of the invention to provide a new and improved correlator circuit that may be utilized with adaptive array systems.

It is another object of the invention to provide a new and improved correlator circuit that is low in cost, reliable and readily adaptable to be used in various systems.

These and other advantages, features and objects of the invention will become more apparent from the following description taken in connection with the illustrative embodiment in the accompanying drawings.

DESCRIPTION OF THE PREFERRED EMBODIMENT

Figure 1:
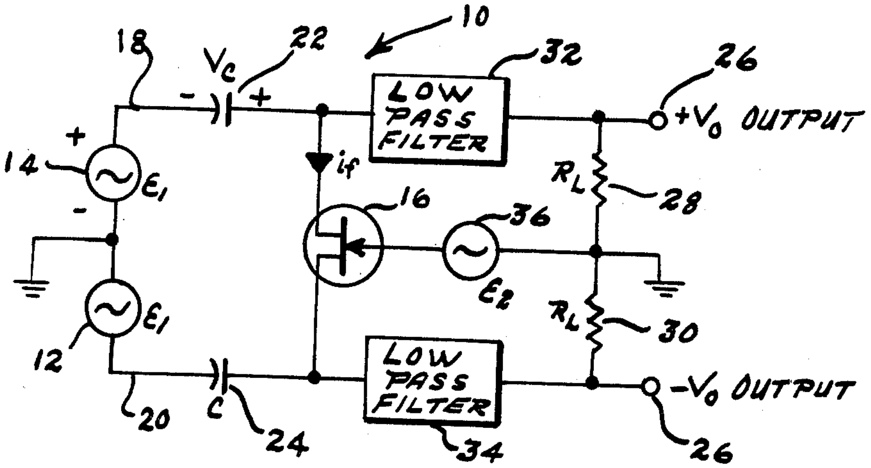
FIG. 1 is a circuit diagram of the invention.

Referring now to FIG. 1, the field effect transistor (FET) correlator circuit is shown generally at 10. In the circuit the bilateral voltage controlled resistor properties of the FET will be utilized. In order to reduce the probability of one signal ($E_1$) coupling into the circuit of a second signal ($E_2$) or the opposite from happening, and thus providing correlator output when only one signal is present, a balanced circuit is sought. It is impractical to obtain FET's matched to the required precision even when two transistors are constructed on a single chip, hence the circuit is designed to function with a single FET. The FET utilizes a channel having a resistivity controlled by varying the bias of the PN junction via a gate connection. This device then has interchangeable source and drain terminals and thus is suitable for use ina balanced circuit.

Source ($E_1$) is shown at 12 and 14 and is in a balanced mode. A transformer or hybrid balun may be used where inputs are unbalanced. The source is connected to the field effect transistor 16 via lines 18, 20, through capacitors 22 and 24. The correlator output $V_o$ (26) occurs across the FET and produces current flow through load resistors $R_1$ (28,30). The capacitors provide a low RF impedance yet isolate the low frequency correlation products from the dc short of source ($E_1$). The second source ($E_2$) 36 is connected to the FET (16) gate where it causes a modulation of FET channel resistivity via action of the junction. Consequently, current flow through the FET is a function of both sources, hence providing the correlation mechanism.

There is some self-impedance associated with source ($E_1$), this resistance is assumed small, however when significant, reduces the correlation output and causes the gain coefficient of the correlator to be source power dependent. Although this effect may be detrimental in some applications, it is of little or no consequence in adaptive arrays.

Figure 2:
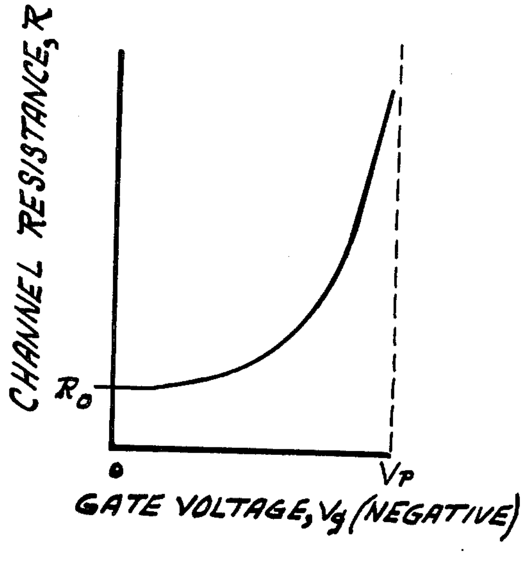
FIG. 2 is a graphic representation of the resistance characteristics of the invention.

With regard to FET, variation of resistance with respect to gate to source voltage $V_g$, a function of channel (drain to source) resistance, $R(V_g)$ where:

$$R\,(Vg) = (\mathrm{Ro}/1 + Vg/Vp)$$

where $R_o$ is the channel resistance when the gate voltage, $V_g = 0$ and $V_p$ is the FET channel pinch-off voltage. This pinch-off voltage is where the channel (drain to source) resistance approaches infinity as illustrated in FIG. 2. If $V_p$ is positive, then an N-channell device is assumed since $V_g = -V_p$ for cutoff. Deviations from this low will result in a multiplier with a gain which is a function of source power; however, as with the source resistance effect, the correlator output remains monotonic and free of power dependent offsets.

Although the invention has been described with reference to a particular embodiment, it will be understood to those skilled in the art that the invention is capable of a variety of alternative embodiments within the spirit and scope of the appended claims.

What is claimed is:

1. A low offset field effect transistor correlator circuit for adaptive processors comprising: a field effect transistor means so constructed as to include interchangeable source and drain terminals and gate means for controlling the resistivity in the transistor means; a first signal input means connected to the source and drain terminals; capacitor means connected between the first signal means and the source and drain terminal means; a second signal input means connected to the said transistor gate means; signal output means; low pass filter means connecting the said transistor source and drain terminals and the signal output means, and load resistor means connected between the output from the source and output from the drain terminals.

* * * * *